United States Patent [19]

Levi

[11] Patent Number: 5,650,629
[45] Date of Patent: Jul. 22, 1997

[54] FIELD-SYMMETRIC BEAM DETECTOR FOR SEMICONDUCTORS

[75] Inventor: Mark W. Levi, Utica, N.Y.

[73] Assignee: The United States of America as represented by the Secretary of the Air Force, Washington, D.C.

[21] Appl. No.: 267,200

[22] Filed: Jun. 28, 1994

[51] Int. Cl.$^6$ .................................................. H01L 21/70
[52] U.S. Cl. ...................... 250/491.1; 250/397; 257/428; 257/448; 257/459
[58] Field of Search .................... 250/491.1, 397, 250/370.01; 257/428, 448, 459

[56] References Cited

U.S. PATENT DOCUMENTS

| 3,693,003 | 9/1972 | Sigsbee et al. | 257/428 |
| 3,700,897 | 10/1972 | Low et al. | 257/428 |
| 3,745,358 | 7/1973 | Firtz et al. | 250/397 |
| 4,081,794 | 3/1978 | Parks et al. | 257/428 |
| 4,109,029 | 8/1978 | Ozdemir et al. | 427/84 |
| 4,238,685 | 12/1980 | Tischer | 250/492 A |
| 4,546,534 | 10/1985 | Nicholas | 29/571 |
| 4,981,529 | 1/1991 | Tsujita | 148/33 |
| 4,992,394 | 2/1991 | Kostelak, Jr. et al. | 437/229 |

Primary Examiner—Jack I. Berman
Assistant Examiner—Kiet T. Nguyen
Attorney, Agent, or Firm—William G. Auton; Harold L. Burstyn

[57] ABSTRACT

An alignment mark and pattern is disclosed for use on semiconductor substrates which are to be patterned in an electron lithography machine. The detector includes two interleaved N-well portions mounted on a P-substrate. The interleaved "fingers" of the N-well portions are spaced to provide narrow gaps which are approximately the width of a projected electron beam. When the beam is located within the gap (or gaps) the projection is in alignment.

20 Claims, 4 Drawing Sheets

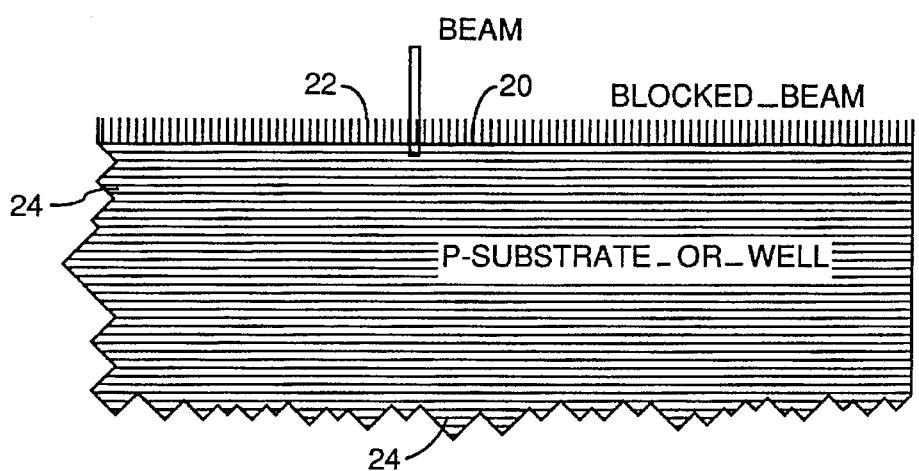
FIG. 5
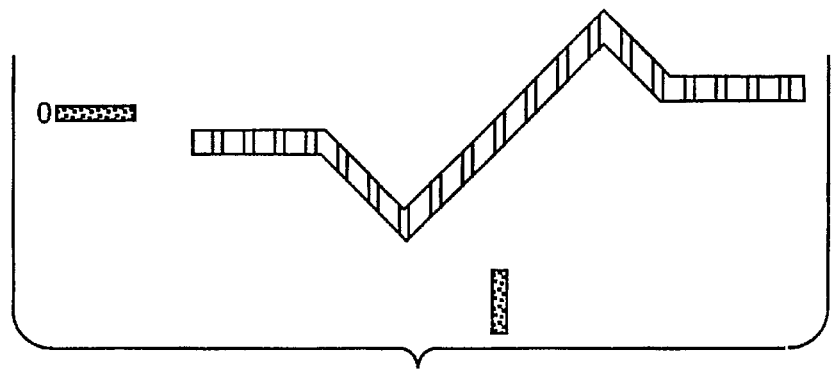
FIG. 6
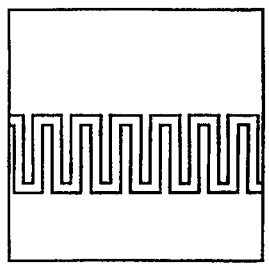 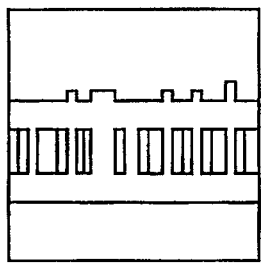 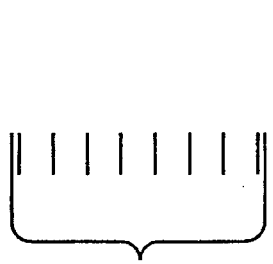 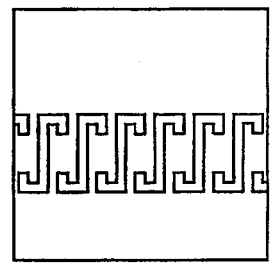
FIG. 7A  FIG. 7B  FIG. 7C  FIG. 7D
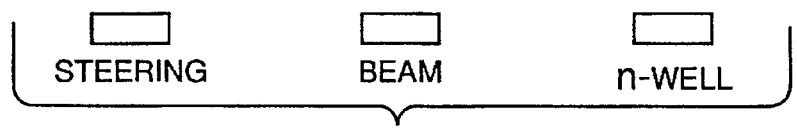
FIG. 7

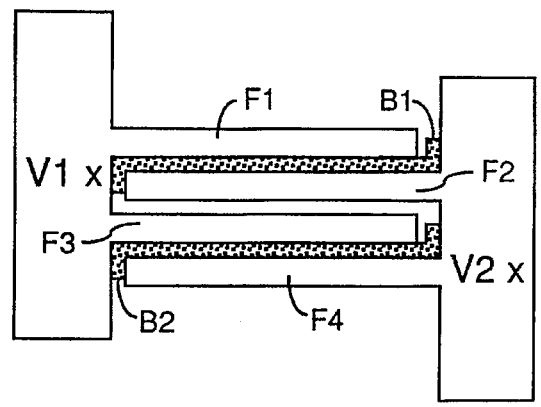
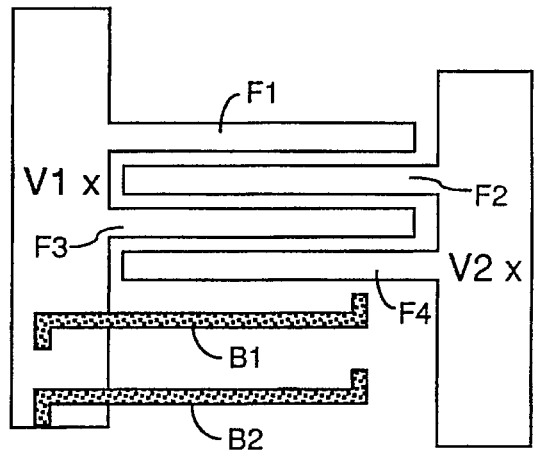
FIG. 8a    FIG. 8b
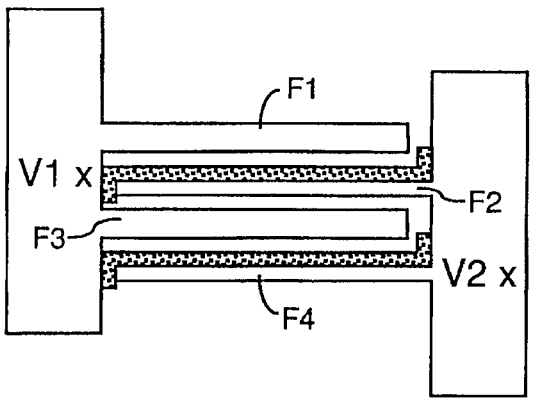
FIG. 8c    FIG. 8d
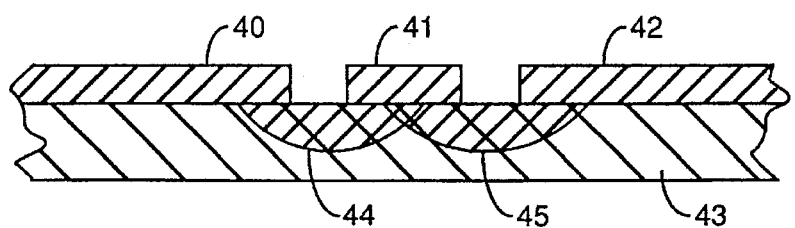
FIG. 9

FIELD-SYMMETRIC BEAM DETECTOR FOR SEMICONDUCTORS

STATEMENT OF GOVERNMENT INTEREST

The invention described herein may be manufactured and used by or for the Government for governmental purposes without the payment of any royalty thereon.

FIELD OF THE INVENTION

This invention provides an improved alignment mark and pattern for use on semiconductor substrates which are to be patterned in a 1:1, electron-projection lithography machine.

BACKGROUND OF THE INVENTION

A 1:1 electron-projection lithography machine permits the projection of an emitted pattern of low-energy electrons from a masked photocathode onto a substrate (e.g. a semiconductor wafer) as a high energy, focused, patterned beam at unity magnification, thereby permitting the transfer of the pattern to an electron sensitive material on the surface of the substrate which can subsequently be caused to selectively alter the substrate. It is possible to control the magnification by a small amount without introducing significant distortion into the projected pattern, even over a large surface such as an eight inch diameter wafer.

In using such a machine to manufacture fine geometry products such as integrated circuits having 0.1 micron features, it is generally necessary to repeat the lithography process with successive beam patterns aligned with previously created structures to an accuracy of one-fourth to one-tenth of the size of the smallest features. Thus, to use 0.1 micron features, it is desirable to align successive patterns to within 0.01 micron. The procedure used in the past for alignment of patterns in such machines has been to use two or more small structures resulting from the first photocathode pattern, which lie substantially at the ends of a diameter of the substrate, as electron detectors, and to provide a matching beam pattern on the succeeding photocathodes.

Typically an electron detector on the substrate is more sensitive to electrons than the surrounding portion of the substrate so signals can be generated which are used to align the small pattern beams with their corresponding detectors.

The prior art generally provides a system in which a beam is moved across a detector. The maximum response of the detector as the beam is moved across it denotes the condition of alignment. In order to obtain a position indication from which a useful centering signal can be derived it is necessary to provide a modulation of the beam position. Unfortunately, this also modulates the position of the entire pattern causing it to lose resolution. Therefore, the modulation must be removed after alignment, and the alignment cannot be monitored during the actual printing of the pattern. In addition, changes in the size of the detectors during intervening processing steps will reduce the sensitivity to position by widening the peak of the response.

PRIOR PATENTED ART

A search of the prior patent art revealed the U.S. Patents described below.

U.S. Pat. No. 4,992,394 issued to Kostelak, Jr. et al is concerned with the enhancement of registration marks for the purpose of improving their detectability, as by an electron beam in electron beam lithography, whereby the accuracy of alignment is improved. This patent does not resolve the problems associated with modulation of beam position, i.e., loss of resolution as well as inability to monitor alignment during actual printing of the pattern. Kostelak, Jr. et al makes no mention of the essence of the present invention, i.e., employment of the symmetric field as the actual "mark" to effect beam alignment.

U.S. Pat. No. 4,981,529 issued to Tsujita is concerned with the problem of erroneous recognition of alignment marks resulting from the interrupted flow of resist by obstructions provided around the alignment marks to prevent uniform covering by the resist film. Tsujita solves this problem by a certain geometric arrangement of certain alignment marks such that the peak intensity levels of diffraction light obtained by the alignment marks are constant. This is unrelated to the teaching of the present invention which uses a symmetric field.

U.S. Pat. No. 4,546,534 issued to Nicholas is concerned with the problem of alignment of the doped region of a semiconductor device, referred to as a parasitic thick field stopper, and the overlying insulating layer pattern, a thick field oxide in the case of IGFETs. The patented method alleged to solve the problem involves two separate exposure steps with the same mask being used for both exposures. Nicholas acknowledges that the steps of his method are quite conventional and does not use symmetric fields as marks to effect beam alignment.

U.S. Pat. No. 4,238,685 issued to Tischer relate to a method for positioning a mask pattern with respect to a substrate. The patented method involves a relative displacement of the x-ray source while maintaining a rigid association between the mask and the substrate, or a relative displacement of the mask and the substrate together while maintaining the ray source fixed. There is no suggestion whatsoever of the present invention procedure of aligning the beam from the ray source with symmetric fields as marks.

U.S. Pat. No. 4,109,029 issued to Ozdemir et al involves sequential formation of first and second masks having openings positionally referenced to first and second alignment marks, respectively. In contrast, the present invention utilizes marks in the substrate as detectors, while effecting alignment of the beam with symmetric fields.

U.S. Pat. No. 3,745,358 issued to Firtz et al involves beam scanning of alignment holes, whereas the present invention involves beam alignment with symmetric fields as marks.

SUMMARY OF THE INVENTION

In summary, this invention is a system and method for detecting and positioning electron beams on semiconductor substrates during electron projection lithography by using symmetric fields as marks. The invention provides for a signal of one polarity if the beam is misaligned in one direction, a signal of the opposite polarity if misaligned in the opposite direction, and a zero signal when properly aligned. The system includes two interleaved N-wells mounted on a p substrate. The interleaved "fingers" of the N-wells are spaced to provide narrow gaps which are approximately the width of a projected electron beam. When the beam is located within the gap the projection is in alignment. In a practical case, a plurality of beams is projected in a pattern identical to the pattern of the gaps.

In accomplishing the foregoing and related objects, the invention also provides for the detection and positioning of a narrow electron beam that is sufficiently energetic to create electron-hole pairs in a semiconductor.

The beam has an elongated cross-section that lies in a plane substantially perpendicular to the direction of beam propagation, and the current density of the beam is symmetric with respect to the centerline of the elongated cross-section.

The detector for the beam is substantially perpendicular to the direction of beam propagation, and includes a first or substrate electrode that is elongated about a centerline which is coincidable with a substantial portion of the centerline of the beam cross-section.

The first or substrate electrode of the detector is locally and substantially symmetric with respect to a generally cylindrical surface generated about the electrode centerline in the propagation direction. A pair of second electrodes is spaced from and substantially parallel to the first or substrate electrode, and from one another. The second electrodes are locally symmetric with respect to the generally cylindrical substrate surface.

At least one substantially electrically carrier-free material occupies space adjoining the electrode substrate and touches each of the second electrodes. The material is locally symmetric about the generally cylindrical substrate surface.

An electric field is established within the electrically carrier-free material, and is locally mirror-symmetric with respect to the general cylindrical surface in the vicinity of the coincidable portion of the centerline of the first electrode, and sufficiently large to separate and collect hole-electron pairs generated within the material by the beam.

As a result, a first current may be deleted and measured flowing between the first or substrate electrode and one of the second electrodes, and a second current may be deleted and measured flowing between the first or second substrate electrode and the second electrode by virtue of separation, within the field, of electron-hole pairs generated within the electrically carrier-free material.

The construction of the portions of the electrodes and beam lying outside coincidable portions of the centerlines is such that only small changes in currents can result from any small lack of coincidence in the direction of elongation. However, the spacings are large enough that processing beyond that required to construct the detector will not make the spacings unusably small. The centerlines are positioned with respect to one another so that their coincidence, and the direction of any small lack of coincidence in a direction perpendicular to the propagation direction and the direction of elongation, may be determined from the magnitude and sign of the difference between the first current and the second current when the coincidable portions of the center lines of the beam and first electrode are coarsely aligned. Positioning can reduce any small lack of coincidence in the perpendicular direction.

The detector can include a first semiconductor electrode of a first conductivity type and a semiconductor substrate of an opposite-conductivity type. The electrically carrier-free material has a carrier-depleted region between the semiconductor of one conductivity type and the semiconductor of opposite conductivity type. The detector also can be formed with electrodes that are metallic conductors.

The detector can include a multiplicity of individual detectors with coincidable portions of centerlines substantially parallel and lying near a plane parallel to the cross-section. The detectors can be displaced from one another in a direction substantially orthogonal to the centerlines, such that the coincidable portions of the centerlines for the detectors are simultaneously coincidable with the coincidable portions of the centerlines of a corresponding multiplicity of beams, with the first electrodes connected in common, and the second electrodes separately connected in common.

The detector can detect currents using resistors connected from the second electrodes to a common voltage source formed from a semiconductor of the same conductivity type as the second electrodes, and voltages can be sensed between the common voltage source and the second electrodes.

The detection of currents can be by resistors connected from the respective common connections of the second electrodes to a common voltage source and formed from a semiconductor material of the same conductivity type as the second electrodes. Voltage is sensed between the common voltage source and the second electrodes.

An alignment pattern can be used on semiconductor substrates which are to be patterned in an electron lithography machine. The detector can include two interleaved N-well portions mounted on a P-substrate, with interleaved "fingers" of the N-well portions spaced to provide narrow gaps which are approximately the width of a projected electron beam. When the beam is located within the gap (or gaps) the projection is in alignment. The electrodes are sufficiently thin that the beam can penetrate through them.

In a multiplicity of such detectors, the coincidable centerlines of the detectors are substantially parallel and lie nearby in a plane parallel to the cross-section such that the centerlines of the detectors are simultaneously coincidable with the centerlines of a corresponding multiplicity of beams.

For a pair of detectors lying near to one another having coincidable centerlines simultaneously coincidable with corresponding beam centerlines, and their coincidable centerlines lying near the plane, with the coincidable centerlines of one of the pair substantially orthogonal to those of the other.

For detecting and positioning a propagated electron beam pattern on a semiconductor substrate, the beam has a pattern comprising at least one narrow electron beam elongated along a centerline that is perpendicular to the direction of propagation of the beam. The current density in the beam is symmetric with respect to the center line. A first electrode comprises a semiconductor of one polarity; second spaced electrodes comprise semiconductors of opposite polarity to the first electrode and are positioned on the first electrode, with the space between the second and third electrodes having a centerline coincidable with the centerline of the electron beam.

A signal of one indication is extracted when the electron beam strikes one of the second electrodes, and the first electrode, and there is another indication when the beam strikes the second electrodes edge. The beam is properly aligned when the centerline of the beam pattern coincides with the centerline of the gap and the indications are substantially equal.

In a detector for detecting and positioning an electron beam pattern that is larger than its width, electron projection lithography is on a semiconductor a P-substrate below elongated N-well fingers on the substrate, each finger having a substantially straight edge and spaced apart by a substantially constant width gap approximately the width of the electron beam and having a centerline coincidable with the center line of the beam.

A signal of one indication is extracted when the beam strikes one N-well finger, or near its edge, and another there is another indication when the beam strikes another N-well finger, or near its edge. The beam is properly aligned when the centerline of the beam pattern coincides with the centerline of the gap, and the indications are substantially equal.

A common voltage supply biases each of the N-wells through first and second resistors, respectively. The electron beam pattern edges and gaps are all made by electron projection lithography, using the same mask for each to insure that the centerlines of the gap and the electron beam pattern coincide.

A detector for detecting and positioning an electron beam pattern on a semiconductor substrate during electron projection lithography includes a P-substrate; first and second elongated N-well portions with each elongated interleaved fingers having spaced apart edges forming gaps of substantially constant width. A plurality of parallel gaps are formed between fingers, and the beam pattern has a geometry corresponding to alternate gaps. A signal of one indication is extracted when the beam pattern strikes one of the N-well portions, or near the edges of one N-well, and there is another indication when the beam pattern strikes the other of the N-wells portions, or near its edges. The beam pattern is properly aligned when the centerline of the beam pattern coincides with the centerline of the gaps, and the indications are substantially equal.

The electron beam pattern, the edges and gaps are all made by electron projection lithography, using the same mask for each to insure that the center lines of the gap and the electron beam pattern coincide.

BRIEF DESCRIPTION OF THE DRAWINGS

These and other features of the invention will become more apparent after considering the following description taken in conjunction with the illustrative embodiment in the accompanying drawings, in which:

FIG. 5 is a cross section FIG. 2;

FIG. 6 is a curve showing the performance of the detector;

FIGS. 7a–7d show the method of making the photocathodes such that the centerlines of beams and gaps match exactly at the central response, and FIG. 7 is an illustration that shows the position and placement of the n-well, beam and steering of the photocathodes of FIGS. 7a–7d;

FIGS. 8a to 8d illustrate the invention schematically; and

FIG. 9 is a schematic showing of an alternate construction of a detector.

DESCRIPTION OF A PREFERRED EMBODIMENT

Figure 1:
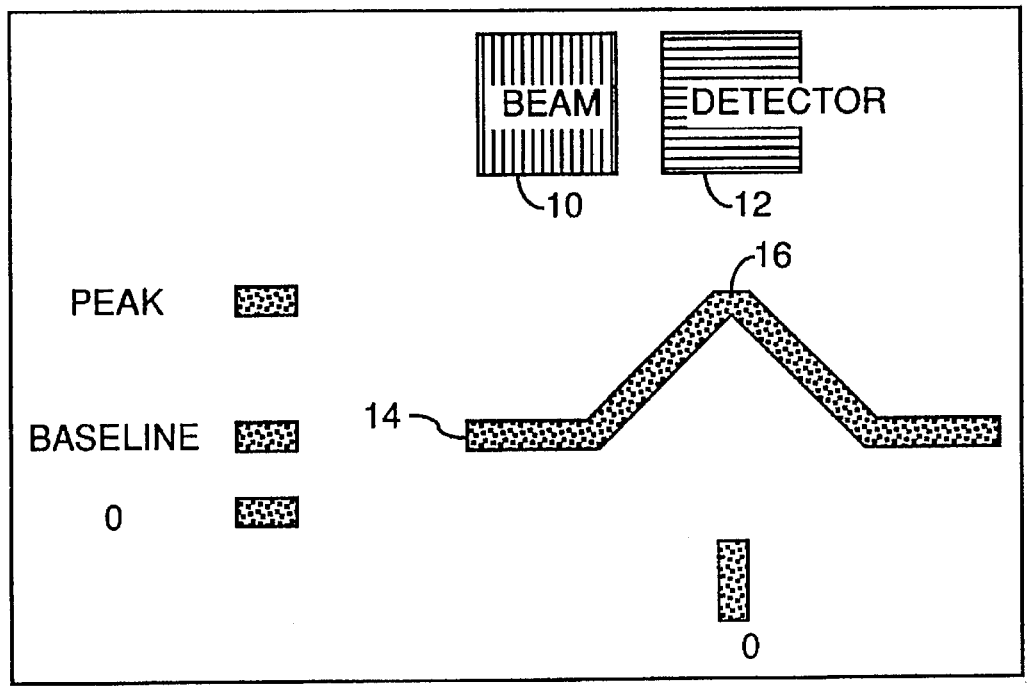
FIG. 1 is illustrative of the performance of the prior art.

The prior art of FIG. 1 shows a misaligned beam 10, a detector 12, and the response 14 of the detector as the beam is moved across it. Note that the condition of alignment is marked by a maximum peak in the response at 16. In order to obtain a position indication from which a useful centering signal can be derived it is necessary to provide a modulation of the beam position, i.e., the beam must move across the detector. Unfortunately, this also modulates the position of the entire pattern causing it to lose resolution. Therefore, the modulation must be removed after alignment, and the alignment cannot be monitored during the actual printing of the pattern. In addition, changes in the size of the detectors during intervening processing steps will reduce the sensitivity to position by widening the peak of the response.

In the prior art, signals from detectors located near the ends of a diameter can be used to correct X alignment, Y alignment and rotational alignment, and to correct magnification errors, provided the detectors at each end are sensitive to both X and Y displacements. This is the case with the detector mark shown if position modulation is provided in both directions. Simultaneous centering of all beams on the corresponding marks must be attained.

Figure 2:
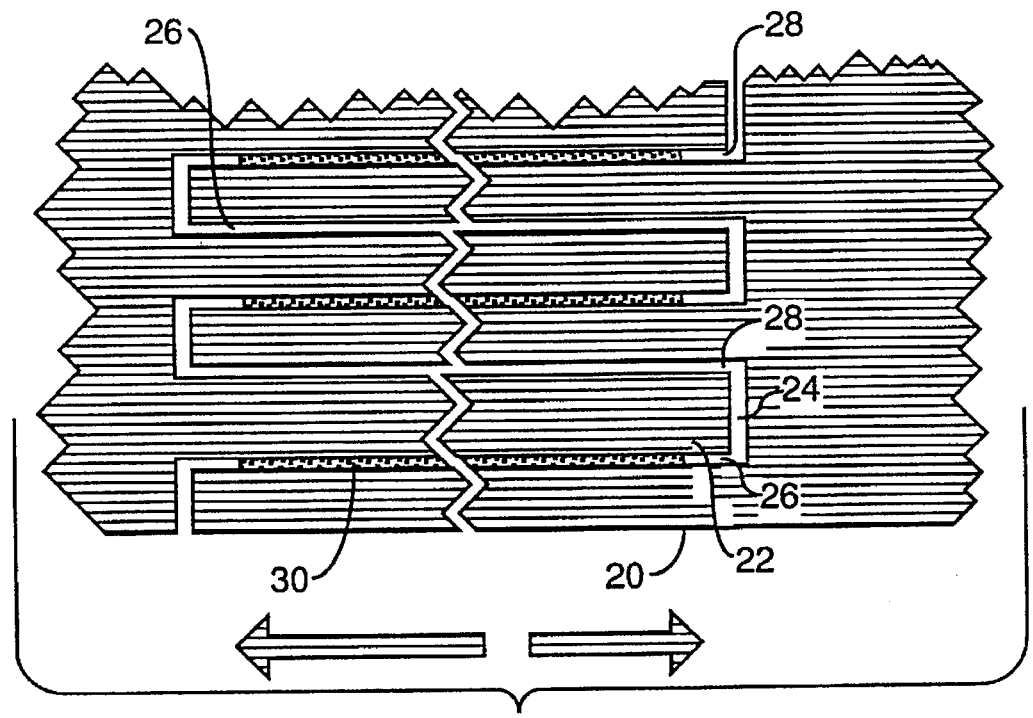
FIGS. 2–4 show successively lower magnification plan views of a set of detectors constructed in accordance with this invention.
Figure 3:
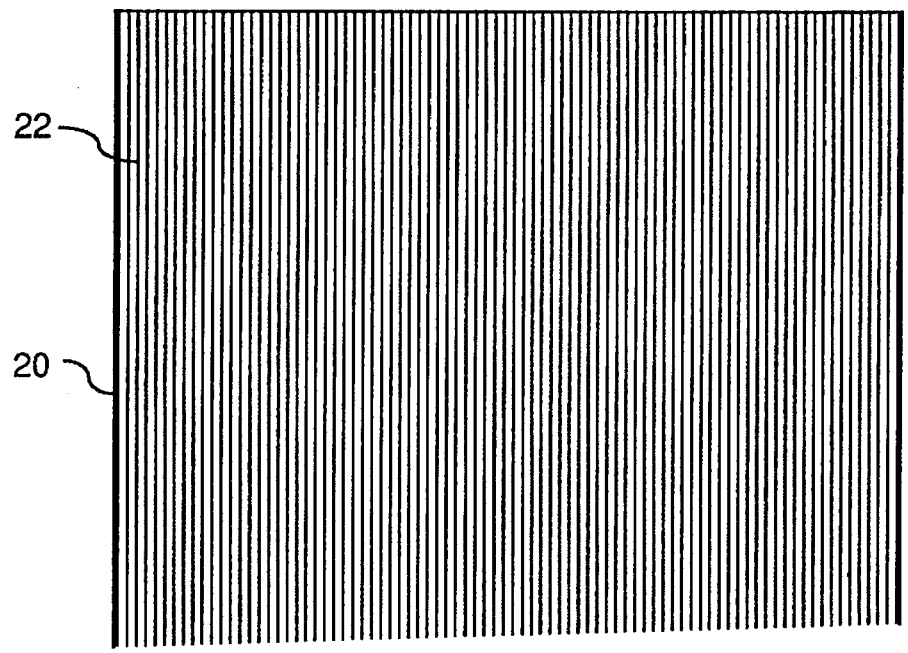
Figure 4:
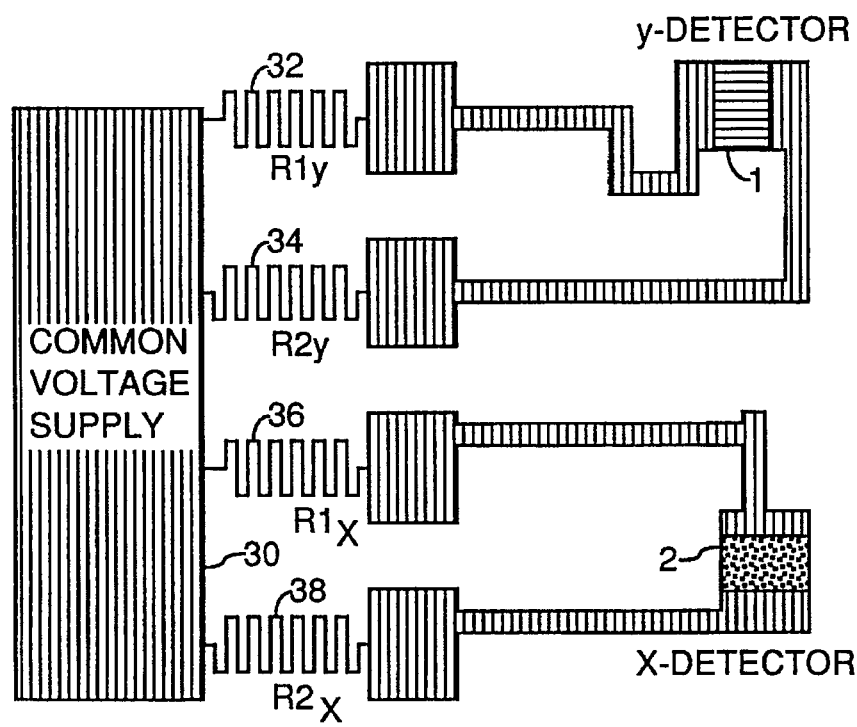

In accordance with this invention, FIGS. 2–4 show successively lower magnification plan views fingers for of a set of X detector 2 (see FIG. 4). FIG. 2 shows part of a rotated view of a detector which is located near the end of a diameter of a substrate. A similar set of detectors (not illustrated in FIG. 4) is located near the other end of the diameter. Each detector X and Y comprises two symmetric sets of, interleaved "fingers" of N-wells e.g. 20 for V1x and 22 for V2x mounted in or on a substrate 24 (better seen in the cross section of FIG. 5, where the beam is shown positioned between finger 20 of V1x and finger 22 of V2x) with gaps 26 and 28 between the interleaved N-wells fingers.

Referring to FIG. 4, where a complete X-Y sensitive mark pair is shown, the system includes a Y detector and an X detector, both powered by a common voltage supply 31 through resistors 32 and 34, and 36 and 38, respectively. The electrons of the beam (indicated by position markers on FIGS. 2–4) preferably have sufficient energy to penetrate through the N-well layer so that some signal is generated whenever a beam is striking the N-well near a piece of an N-well edge to create electron hole pairs within collection range of the N-well edge.

Wherever the electron beam traverses a semiconductor, it generates many electron-hole pairs. The common supply voltage biases the N-well to form a depletion region between the N-type and P-type regions. In order to get the best resolution the beam should also penetrate far enough into the undepleted P-type portion of the substrate to reduce the number of straggling electrons which can reenter the depletion region. Under these conditions the holes will be collected by the substrate and the electrons will be collected primarily by the nearest part of the N-well. If the beam strikes entirely though N-well, then all the current from the pairs generated in the depletion region beneath the well will be collected by that piece of the N-well. However, if the beam strikes exactly centered on the gap between the two pieces of N-well edge, they will collect the current equally as long as the voltage on the two pieces of N-well edges remain equal. This will be the case when the resistors formed by the narrow portions of the N-wells ($R1_x$ and $R2_x$) in FIG. 4, for example) are equal. Provided that these resistors are low enough in resistance that the voltage drops in them caused by the currents are small compared to the voltage supply, the symmetric field in the gap between the pieces of N-well edge will be substantially maintained even when the beam is off center in the gap. The actual marks are the alternate symmetric fields between adjacent "fingers" of the N-well.

Refer now to FIG. 8a, where the detector is shown in its simplest form. That is, where the N-wells of the detector are shown with only two fingers F1 and F2, and with an elongated electron beam B1 located in the gap between the fingers. In the position shown, the voltages developed by the system are equal to zero and the beam is aligned in the horizontal (or X) direction.

In the arrangement shown in FIGS. 8b to 8d, each of the N-wells are shown with two fingers F1, F3 and F2, F4, respectively. A beam pattern consisting of elongated narrow beams B1 and B2 having the identical shape and size as the gaps between the fingers F1 and F2, and F3 and F4, respectively, is projected onto the detector. If the beams B1 and B2 are located in the gaps as shown in FIG. 8b, the system is in alignment and the voltage developed is equal to zero. However, if the beam is out of the gaps, as shown in FIG. 8c, voltages will be developed on the V2x N-well. On the other hand if the beams are on the V1x well, a differential voltage of the opposite polarity is developed. In either case, the system is known to be out of alignment.

It is noted that in FIGS. 8a to 8b, the length of the beam is equal to the length of the gap. While this feature is not essential to the operation of the overall system, it does provide course alignment in the Y axis. Note, for example in FIG. 8d, the beam is not in a gap, but is positioned on the V1x well. By aligning the beams between the 2 wells, the system will be coarsely aligned on the Y-axis. Fine alignment will be completed with the Y detector.

It should be noted that it is not necessary that the fingers be exactly parallel. It is important that projected beam have a substantially identical shape as the gap between pairs of fingers into which the beam is projected. It should also be noted, that the number of fingers in each detector is chosen as a function of required sensitivity. One or two gaps, as shown in FIGS. 8a to 8d, may not, in a practical case, provide sufficient detector sensitivity.

The differential voltage characteristic ($V2_x$–$V1_x$) versus misalignment of such a detector is shown in FIG. 6. The only effect of the small field asymmetry mentioned above would be a slight broadening of the characteristic around the exact alignment position. The exact balance would remain at the exact alignment point. A similar broadening effect will result from a symmetric change in the size of the gap or beam by some processing step.

The characteristic shown is local around the position where all the beam centerlines of a detector are aligned with their corresponding gaps' centerlines (note the gaps are really all parts of a single gap since the topology of the entire N-well pattern in FIG. 4 is that of a circle). Providing the beams of a detector are all spaced equally, a similar but smaller amplitude signal will be found when a smaller number of beams are aligned. This characteristic makes for ease of coarse positioning since the successive coincidences can simply be counted as the set of beams of a detector is swept from outside the detector to the central alignment position. The crossing of beams with the gaps corresponding to blocked beams has an inverted characteristic. Note that a small rotational misalignment does not change the location of the central largest response, but only its amplitude. Small in this case means small enough that most of each beam is striking its corresponding gap when the center of the beam is centered on its gap. That is one of the reasons for choosing the length of each beam to be no more than four hundred times it width; mechanical initial alignment of substrate rotation can easily be done to well within that tolerance, for example, 0.001 inch at each end of the diameter. The widths of the beams and gaps are chosen to be greater than the minimum geometry in order to insure against lithographic faults which might short N-well across a gap, after many processing steps. That also reduces the necessity for having exact evenness of spacing of the gaps; in fact, small variation in the relative rotations and spacings of the gaps and their corresponding beams can be used intentionally to reduce all of the responses but the exact-matching correct ones.

The response of the detector as a whole is much like the derivative of an autocorrelation function between gaps and beams. The distance from gap to gap is chosen to be great enough to insure a negligible distortion of the symmetry of the field at each gap. This will also give a clean separation of successive responses as the beams sweep across the detectors. A further consideration is that the voltage drops in the two "fingers" of a gap should be small. This last criterion is not critical since such drops would produce field asymmetries which would mostly cancel at the correct alignment position, slightly reducing the amplitude of the response.

FIG. 9 shows a variation where the three electrodes 40, 41, and 42 are metallic conductors and such that there is physical symmetry of the current density in the beam about its centerline and of the electrodes about the centerline of the middle electrode. All three are on, or in, a carrier-free substrate 43 which might be almost any insulator provided that enough voltage can be applied from the outer two to the middle one for hole-electron pairs (generated by a beam which could either penetrate the electrodes or be wider than the center electrode) to see a locally anti-symmetric field which will separate them so as to provide equal currents to the outer two when the beam is aligned. The important points are the physical mirror-symmetry which creates a mirror-symmetry of the electric field from a symmetric potential (scalar) field.

In all of the above, it has been assumed that the centerlines of beams and gaps match exactly at the central response. This can be insured by making the photocathodes of both by electron projection lithography from a common pattern but using opposite "tones". This is illustrated in FIGS. 7A to 7D. The original pattern could be that of the meander which forms the gap plus the surrounding field as in FIG. 7A. This pattern is put onto two photocathodes. One of the photocathodes is then used for the first pattern in the lithography process, from which the N-well pattern is generated, while the other is altered (by a process which need not be very accurate), as in FIG. 7B, so as to remove the bends of the gap pattern and alternate beam patterns, and printed with a "tone" to produce beam pattern rather than N-well pattern, for example, negative and positive resists, respectively.

The surrounding fields should also be blocked (not shown). Alternate beams are removed since they would cancel the differential responses. At the correct alignment, each beam should have the correct phase in its response. In the blocking process illustrated, each beam length is reduced enough so that at alignment condition, the beams are well away from the asymmetric fields where the gap changes direction, and centered in both directions. However, as pointed out with respect to the simplified embodiments illustrated in FIG. 8a to 8d, it is to be understood that the beam length may be made equal to the gap length.

Note that a detector retains some discrimination of position even when the beams are seriously out of alignment in the direction parallel to the length of the beams. The portion of the beams which overlap one of the end areas simply cause a constant differential signal. The overlaps, of course, disappear as both X and Y beams come to central alignment.

Not shown in FIG. 5 are overlying layers such as a resist and a conductive layer deposited on top of it to prevent charge accumulation on the surface. Charge accumulation on the surface causes beam pattern distortions. Such a conductive layer shields the beams from any fields used in the detectors. Overlying layers, particularly P-type or intrinsic semiconductor, will merely provide additional sensitive volume while maintaining the field-symmetry of the gaps. Slight surface leakage should have no significant effect on operation.

The various connecting areas (V1, V2, Common Supply, etc.) must have probes to them for signal extraction and voltage supply. These probes must be positioned such as not to introduce irreproducible distortion in the electric field of the machine since that would affect the alignment. One way to accomplish that is simply to put the probe pads at a moderately large distance (a few millimeters) from the detectors as indicated by the unspecified length of the connecting part of the N-well pattern. Such a location permits the shielding of these connecting areas from processing steps, and permits low resolution removal of connection obstructing layers. Connection must be made to the substrate or P-well for return current.

The overall sensitivity of the detector is controllable by adjusting the common supply voltage. This has two effects, both of which are due to the change in the thickness of the depletion layer: 1) the sensitive volume changes, and 2) the resistance per square of the sensing resistors changes. These are aiding effects. The effects of a moderate change in size of the N-well pattern (which narrows the gap) can also be compensated as long as even a partial gap remains. The illustrated layout is not, but can and should be capacitively balanced. The connection pads should be heavily doped for good connections.

Electron-projection lithography is well known in the prior art. It is known that if a plane surface in a vacuum is caused to emit a pattern of low energy electrons by masking and illuminating it while a parallel plane surface is maintained at a high potential relative to the first surface, then the transit time of all the emitted electrons to the second surface will be substantially identical. If a magnetic field perpendicular to the two planes is set at such a value that the period of the cyclotron resonance of electrons in that field is an integral fraction of the transit time than all electrons leaving a point on the first surface will return to a point on the second surface directly facing the point on the first surface, creating an image in high energy electrons suitable for exposing a pattern in a resist layer on the second surface. The second surface may be a silicon wafer, e.g., or may be a blank which is intended for use as another mask. The resolution of the image is comparable to that of electron microscopes having similar accelerating voltages.

Low-distortion control of the position or orientation—relative to a preexisting structure on the second surface—at which the electron pattern strikes can be obtained by mechanical motion or, for small motions of the pattern, by applying small uniform magnetic fields perpendicular to the main field. Small changes in magnification or demagnification of the projected pattern can also be made by producing a small non-uniformity in the main magnetic field.

The advantages of this invention are its superior accuracy of alignment, the ability to verify and maintain alignment during the actual printing of the overall substrate pattern and the availability of signals which can be used in coarse positioning without losing sensitivity for fine positioning. The new features are the use of symmetric fields as "marks", the provision of sensitivity and size adjustments, and the topology which permits the inclusion of multiple relatively short beams by sacrificing roughly half of the beams which could be place in order to phase the signal from all remaining beams coherently.

Many alternatives should be obvious to persons skilled in the semiconductor art. For example, N-type and P-type materials may be interchange. Dimension can be altered within relatively wide limits. The N-well can be on the surface of the P-type material rather than be embedded in it. There may be silicon dioxide in the gaps, or partially in the gaps, rather than semiconductor etc. providing the locally mirror-symmetric fields are maintained. The symmetry is mirror symmetric, i.e. symmetric about a plane, physically and for the potential, making the field (which is the gradient of the potential) anti-symmetric.

Moreover, while the embodiments shown in FIGS. 2–8 show a detector having first and second wells having straight "fingers" which are interleaved in parallel relationship, it is to be understood that a detector may be constructed wherein the fingers are made of various shapes, so long as the parallel relationship between them is maintained, and so long as the beam is symmetrical with the gap.

In addition, as shown in FIG. 9, there may be three conductors 40, 41 and 42 mounted on a substrate 43. The important thing is that there are a pair of collection volumes 44 and 45 established by two electrodes 40 and 42 at one potential, and a third electrode 41 centered in the gap between the first two at a second potential, so as to create a symmetric pair of charge collection volumes. An electron beam of substantially uniform current density directed toward the detector is such that when the centerline of the beam coincides with the centerline of the third electrode 41, equal numbers of charge pairs are generated in the two sensitive volumes.

Clearly, many other modifications and variations of the present invention are possible in light of the above teachings and it is therefore understood, that within the inventive scope of the inventive concept, the invention may be practiced otherwise than specifically claimed. For example, while each of the claims specifies a P-substrate and N-wells, although not as desirable in its application, an N-substrate and P-wells are deemed to be the full equivalent.

What is claimed is:

1. A detector for detecting the extent of alignment of an electron beam, comprising:

a first electrode;

a plurality of second electrodes spaced from one another to form a gap between each pair of adjoining second electrodes; and means for biasing the first and second electrodes to create a carrier-free region between said first electrode and each second electrode;

whereby said electron beam striking one of said second electrodes, or said gap between said second electrodes, cause a differential flow of current having a magnitude and direction depending upon the position of said beam relative to said second electrodes.

2. A detector according to claim 1 wherein said first electrode is a semiconductor of one conductivity type and said second electrodes are semiconductors of an opposite conductivity type.

3. A detector according to claim 1 wherein the first and second electrodes are all metallic.

4. A detector according to claim 1 wherein said first electrode is a doped substrate upon which said second electrodes are mounted.

5. A detector according to claim 1 wherein each second electrode includes a multiplicity of elongate fingers which are interleaved with a multiplicity of fingers of another second electrode.

6. A detector according to claim 5 wherein the fingers of said second electrode are parallel to one another.

7. A detector according to claim 1 wherein the biasing means comprises a substrate upon which the second electrodes are mounted and spaced from one another.

8. A plurality of detectors, each according to claim 1 wherein the first electrodes of said detectors and their second electrodes are respectively connected in common.

9. A pair of detectors, each according to claim 1 wherein the second electrodes of one pair are orthogonal to the second electrodes of the other pair.

10. A pair of detectors, each according to claim 1 wherein the second electrodes of said pair are respectively connected in common, with the second electrodes of one pair orthogonal to the second electrodes of the other pair.

11. A detector according to claim 1 wherein the means for biasing comprises respective resistors extending to a common voltage source formed from a semiconductor of the same conductivity type as said second electrodes.

12. The method of detecting the extent of alignment of an electron beam, comprising the steps of:

(a) providing a first electrode positioned relative to a plurality of second electrodes having a gap therebetween each pair thereof;

(b) biasing the first and second electrodes to produce a carrier-free region in a substrate between said first electrode and each second electrode; and (c) causing said electron beam to strike said substrate through said second electrode, or said gap between said second electrodes, whereby a differential flow of current from affected said second electrodes has a magnitude and direction dependent upon the position of said beam relative to said second electrodes.

13. The method of claim 12 wherein said beam is caused to have sufficient energy to penetrate through said second electrode.

14. The method of claim 12 wherein the biasing of said first and second electrodes produces a depletion layer between said first electrode and each second electrode.

15. The method of claim 14 wherein said beam is caused to have sufficient energy to penetrate beyond said depletion layer to reduce the incidence of electrons which enter said depletion layer.

16. The method of claim 12 wherein said gap has a length and said beam is caused to have a length which is substantially that of said gap.

17. The method of claim 12 wherein sensitivity is increased by increasing the number of said second electrodes, and said first and second electrodes are biased through resistors providing a substantially smaller voltage drop than the source of the biasing.

18. The method of claim 12, further comprising the step of depositing a resist conductive layer on the surface of the detector or to inhibit charge accumulation on the surface of the detector.

19. The method of claim 12, further comprising the step of positioning probe pads for signal extraction to avoid electric field distortion from the gaps of said second electrodes.

20. The method of detecting and assuring alignment of an electron beam with a prescribed gap of a detector, comprising the steps of:

(a) making photocathodes by electron beam projection lithography starting with a common gap pattern produced in one tone;

(b) adapting said gap pattern for said beam using an opposite tone to remove alternate gaps;

whereby the centerlines of beams and gaps match at central response.

* * * * *